United States Patent [19]

Melkeraaen

[11] Patent Number: 4,626,822

[45] Date of Patent: Dec. 2, 1986

[54] THICK FILM RESISTOR ELEMENT WITH COARSE AND FINE ADJUSTMENT PROVISION

[75] Inventor: Torleiv O. Melkeraaen, Park Ridge, Ill.

[73] Assignee: Motorola, Inc., Schaumburg, Ill.

[21] Appl. No.: 729,776

[22] Filed: May 2, 1985

[51] Int. Cl.[4] .................... H01C 10/00; H01C 1/012; H01C 1/01; H01C 17/06

[52] U.S. Cl. .................................. 338/195; 338/308; 338/309; 338/320; 29/620

[58] Field of Search .............. 338/195, 308, 309, 320; 29/620

[56] References Cited

U.S. PATENT DOCUMENTS 4,243,969  1/1981  Steigerwald et al. ......... 338/320 X
4,531,111  7/1985  Schmidt et al. .................... 338/195

*Primary Examiner*—E. A. Goldberg
*Assistant Examiner*—Linda M. Peco
*Attorney, Agent, or Firm*—Donald B. Southard

[57] ABSTRACT

A thick film resistance element is disclosed which is especially suited for use on hybrid circuit subassemblies, which resistance element includes both coarse and fine adjustment, such as by laser beam trimming operation. The resistance element includes a first segment having a given resistance value per unit area and a second segment abutting the first segment along one edge thereof. The second segment includes a resistance material with a differing resistance value per unit area than exhibited by such first segment. In the trimming operation, a laser beam cuts a longitudinal slot in the segment with the higher resistance point below the desired value. The laser beam then cuts a similar longitudinal slot in the other segment to a point where the desired resistance value is obtained.

6 Claims, 3 Drawing Figures

THICK FILM RESISTOR ELEMENT WITH COARSE AND FINE ADJUSTMENT PROVISION

BACKGROUND OF THE INVENTION

This invention relates in general to thick film resistors and more particularly to such component elements which include both coarse and fine adjustment capabilities and especially adapted to laser beam trimming operations.

Thick film resistors are of course known in the art. Usually such circuit elements of this type are formed by substrate, such as ceramic, in the form of a thin sheet layed down from a suitable resistance ink or paste i.e., one that has a desired resistance characteristic per unit area. The absolute value of the resistance element so formed is customarily less than the ultimate or desired resistance so that the element can be customed trimmed to the exact value needed for the associated circuit in which it is to be utilized.

Such trimming to need is very frequently effected by laser beam. The laser cuts a longitudinal slot through the layer of resistance ink, creating a longer path that the current must travel, thereby raising the resistance value of the element. There are two important factors to be considered which essentially work at cross purposes to each other. The actual laser beam cutting must be effective in as short a period of time as conveniently attainable so as to optimize production time. However, too fast a change in resistance value will often, and in some cases almost certainly result in an overshoot with regard to the desired resistance value. That is, the cut would be too long and resistance value too high before the laser beam can be suitably controlled (stopped).

This problem has been addressed in the past on one basis or another but which in the main have all proved to be unsatisfactory. For example, one known prior art device includes a thin film resistor element having a tapered configuration such that a laser beam cut starting at the narrowed base will provide a faster resistance change for the element as a whole than when the beam begins to cut into the wider top section, in essence slowing the resistance change on a progressively slower basis as the laser beam travels along its intended cut path. However, while this concept might be considered to be is on the "right" track, actually the change rate of resistance change is in fact not that significant.

There are still other approaches that have been tried as well. One such prior device utilizes various (multiple) cuts, some traverse, and some along the longitudinal axis of the resistance element being trimmed. Still another approach is where multiple cuts are also made, but all utilize parallel cut paths. In both instances, the cuts are made in a homogeneous layer of resistance material where the resistance value per unit area remain uniform throughout. The same considerations as referenced previously as to factors which work at cross purposes to one another still apply.

Accordingly, what is needed is flat, sheet like thick film resistance element of a substantially uniform, rectilinear shape, which nevertheless was provision for coarse and fine trim adjustments that can be effected in the resistance element in a short period of time so as to optimize production parameters and which is fully compatible with computer-controlled laser beam trimming procedures.

SUMMARY OF THE INVENTION

It is an object of the present invention to provide a thick film resistance element especially suited for use with hybrid circuits and which overcomes the foregoing deficiencies.

A more particular object of the present invention is to provide a thick film resistance element of the foregoing type which includes a coarse as well as a fine tune adjustment without materially affecting the speed of the laser beam cut.

Still another object of the present invention is to provide a thick film resistance element of the foregoing type which includes coarse and fine adjustment capabilities represented by separate resistive inks which produce different rates of resistive changes for a given length of laser cut.

In practicing the invention, a flat, ribbon-like sheet of resistance ink or paste is provided between associated terminals or conductors included on the surface of a ceramic substrate of an associated hybrid circuit. The resistance element includes first and second portions or segments. One such segment has a high resistance value per unit area, say for example, 300K ohm/unit area, while the second segment has a somewhat lower value, say for example, 100K ohms per unit area. The first segment accomodates a laser cut which brings the resistance element to within a certain range *below* the desired value and thereby serves as a coarse adjustment. The second portion or segment then accomodates a like laser cut, but because of the lower rate of change for the resistance per unit area, serves to provide a fine tune adjustment capability.

BRIEF DESCRIPTION OF THE DRAWINGS

The features of the present invention which are believed to be novel are set forth with particularity in the appended claims. The invention itself, however, together with further objects and advantages thereof, may be best understood by reference to the following description when taken in conjunction with the accompanying drawings in which:

DESCRIPTION OF THE PREFERRED EMBODIMENT

Figure 1:
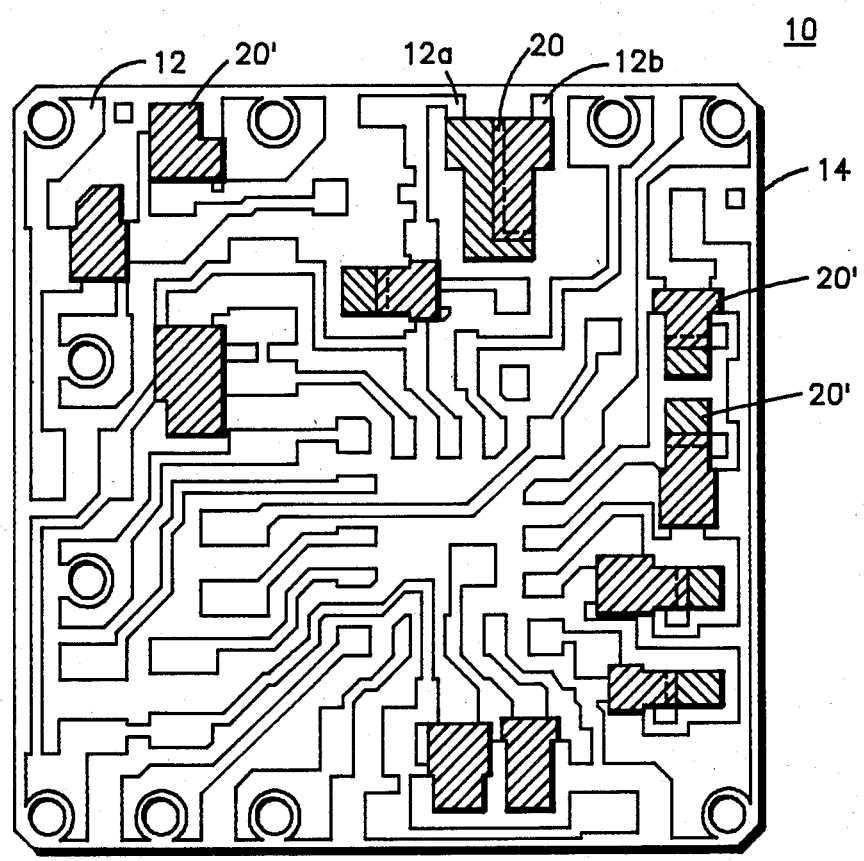
FIG. 1 is a graphic representation of the layout of a typical hybrid circuit, sams certain associated circuit elements, where a thick film resistors of the present invention may be utilized to advantage.

Referring now to the drawings, a hybrid circuit 10 is shown in FIG. 1 which may be considered as typical of those in which the present invention may be used to advantage. The hybrid circuit typically includes a plurality of formed conductor 12 included on a ceramic substrate 14. Between certain other conductors, say for example, conductors 12a and 12b, formed resistance element 20 may be included substantially as shown. The hybrid circuit 10 may also include other circuit element (not specifically shown) such as integrated circuit assemblies, chip capacitors, SOT's inductors, active devices and the like. Circuit tolerances are such that it is necessary to custom trim the flat resistance element such as that shown at 20 to a specific value. There are number of ways this can be effected, such as abrasion, or more conveniently, by laser beam trimming, preferably controlled by a computer.

In laser trimming, the flat ribbon-like resistance element 20 is cut by the beam along a longitudinal axis thereon such that the current path between the associated conductors 12a and 12b is lengthen and the resistance presented therebetween is effectively increased. The longer the cut the greater resistance presented between such terminals, 12a and 12b.

As mentioned previously, a problem has existed in the past with laser beam trimming operations wherein had the tendency to overshoot the target resistance value has been noted. Once the resistance is overshot, it must be repaired or, if not possible, the hybrid circuit assembly simply scrapped. Scrapped assemblies have components such as the previously mentioned IC chips, capacitors, SOT's and the like which may or may not be salvagable. But all of the repair and/or salvage efforts require time, effort and in the end, cost increases concerning production. Simply slowing down the laser cut to minimize overshoot is likewise unacceptable since there may be multiple cuts or trims per piece or hybrid circuit which slows production accordingly.

Figure 2:
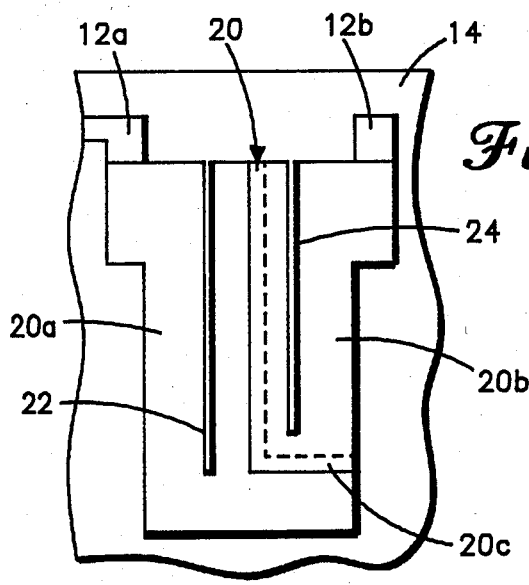
FIG. 2 is a graphic representation of the flat thick film resistance element which has been constructed in accordance with the present invention.

Therefore, what is needed is a means of laser beam trimming at an acceptable, i.e. efficient rate, but wherein assurance is had of the avoidance of undesirable overshoot. These and other objectives are fully met in the construction of the flat ribbon-like resistance element embodying the present invention and which is substantially illustrated in FIG. 2. As therein shown, the resistance element 20 includes segments 20a and 20b. Segment 20a may be somewhat L-shaped as illustrated. An area of overlap between segments is indicated at 20c.

Segment 20a is preferrably fabricated of a resistance ink or paste which exhibits a relatively high (H) sheet resistance, say for example, 300K ohm per unit area. The resistance ink or paste may be conveniently applied to the associated substrate by a silk screening process well known in the art. Following completion of segment 20a, a like procedure is utilized to lay down segment 20b adjacent the former, substantially as shown. To insure electrical continuity, segments 20a and 20b are made to slightly overlap one another such as indicated by the area designated at 20c.

Figure 3:
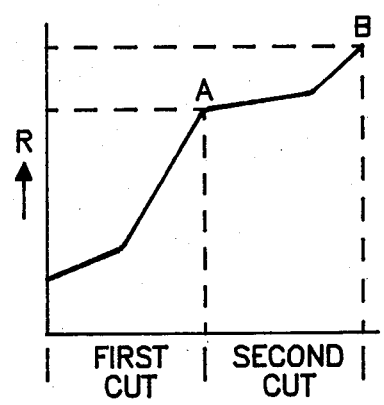
FIG. 3 is a graph showing the performance characteristics of the resistance element of FIG. 2 when trimmed by laser beam operation.

The resistance element 20 thus fabricated provides a coarse and a fine trim adjustment capability. For the coarse adjustment, the first trim should take place on segment 20a, i.e. on the highest sheet resistance area. The trim, as shown by laser cut 22, brings the resistance element 20 up to a predetermined value *below* the final desired value, say 80 to 90% of the final target above. This is graphically portrayed in FIG. 3 at junction point A.

Following laser cut 22 a similar trim is made on the lower sheet resistance area, or segment 20b. This trim, as shown at 24, takes a resistance element 20 up to its final desired value, such as graphically represented at junction B in FIG. 3. Since the sheet resistance is lower, on the order of ⅓ of that of segment 20b for the examples previously shown, the same rate or speed of laser cut nevertheless produces a corresponding reduction in the change in resistance so that the desired value of resistance is thereby approached at a rate which better protects against overshoot and enables an increase in the yield of the hybrid assemblies being produced.

Accordingly, what is claimed is:

1. A flat ribbon-like thick film resistance elements especially suited for use in hybrid circuit assemblies between associated terminals on the substrate base, said resistance element having coarse and fine tuning adjustment capabilities, including in combination:
   a flat rectilinear sheet of resistance material formed and positioned between the associated terminals on a hybrid circuit substrate and exhibiting a given resistance lower than the desired resistance values,
   said resistance element providing a coarse laser beam trim adjustment by a first portion or segment formed by a resistance material of a given area effecting a given resistance value per unit area, said resistance element further providing fine laser beam trim by a second portion or segment formed by a resistance material of a given area effecting a lower resistance value per unit area than exhibited by said first portion.

2. A resistance element for use in hybrid circuit assemblies in accordance with claim 1 wherein said first and second segments overlap along a contiguous edge therebetween.

3. A resistance element for use in hybrid circuit assemblies in accordance with claim 1 wherein said first segment is L-shaped and abuts said second segment along one side and the bottom thereof.

4. A method of fabricating and trimming a thick film resistance element to desired value on a hybrid circuit assembly, comprising the steps of:
   laying down first and second rectilinear sheets of resistance material in a side-by-side abutted relation on the substrate of said hybrid circuit to form first and second segments, said segments exhibiting differing resistance values per unit area;
   cutting a slot by laser beam in said segment exhibiting the higher resistance value per unit area along a longitudinal axis thereof to a predetermined point below the desired resistance value; and
   cutting a slot by laser beam in said other segment along a longitudinal axis thereof to a point where said desired resistance value is obtained.

5. A method of fabricating and trimming a thick film resistance element to a desired value in accordance with claim 4 wherein said first and second segments are layed down in a manner whereby they overlap along a contiguous edge therebetween.

6. A method of fabricating and trimming a thick film resistance element to a desired value in accordance with claim 4 one of said segments is formed in an L-shaped configuration to abut said other segment along one side and the bottom thereof.

* * * * *